United States Patent
Cho et al.

(10) Patent No.: US 11,744,120 B2
(45) Date of Patent: Aug. 29, 2023

(54) DISPLAY DEVICE AND MANUFACTURING METHOD THEREOF

(71) Applicant: Samsung Display Co., LTD., Yongin-si (KR)

(72) Inventors: Hyun Min Cho, Hwaseong-si (KR); Tae Sung Kim, Incheon (KR); Yun Jong Yeo, Hwaseong-si (KR); Ji Youn Nam, Seoul (KR); Hee Min Yoo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 107 days.

(21) Appl. No.: 17/212,046

(22) Filed: Mar. 25, 2021

(65) Prior Publication Data
US 2021/0376023 A1  Dec. 2, 2021

(30) Foreign Application Priority Data

Jun. 2, 2020 (KR) .......... 10-2020-0066613

(51) Int. Cl.
| | |
|---|---|
| *H01L 27/32* | (2006.01) |
| *H01L 51/56* | (2006.01) |
| *H10K 59/124* | (2023.01) |
| *H10K 59/122* | (2023.01) |
| *H10K 59/123* | (2023.01) |
| *H10K 71/00* | (2023.01) |
| *H10K 59/12* | (2023.01) |

(52) U.S. Cl.
CPC ......... *H10K 59/124* (2023.02); *H10K 59/122* (2023.02); *H10K 59/123* (2023.02); *H10K 71/00* (2023.02); *H10K 59/1201* (2023.02)

(58) Field of Classification Search
CPC .................. H01L 27/3246; H01L 27/3258
See application file for complete search history.

(56) References Cited

U.S. PATENT DOCUMENTS

| | | | |
|---|---|---|---|
| 6,218,206 B1 * | 4/2001 | Inoue | H01L 29/66765 257/E21.414 |
| 6,630,274 B1 * | 10/2003 | Kiguchi | G02B 5/201 430/7 |
| 6,720,198 B2 * | 4/2004 | Yamagata | H01L 27/3246 438/149 |

(Continued)

FOREIGN PATENT DOCUMENTS

| | | | | |
|---|---|---|---|---|
| KR | 10-0710996 B1 * | 4/2007 | ......... | B32B 2457/20 |
| KR | 100710996 B1 | 4/2007 | | |

(Continued)

OTHER PUBLICATIONS

Machine translation, Cho, Korean Pat. Pub. No. KR10-071996B1, translation date: Sep. 3, 2022, Espacenet, all pages. (Year: 2022).*

(Continued)

*Primary Examiner* — Victoria K. Hall
(74) *Attorney, Agent, or Firm* — Cantor Colburn LLP

(57) ABSTRACT

A manufacturing method of a display device includes: forming a transistor on a substrate; forming an organic insulating layer on the transistor; and performing a plasma treatment on the organic insulating layer. The organic insulating layer includes an acryl-based polymer, and the plasma treatment is performed by using helium gas or argon gas.

17 Claims, 18 Drawing Sheets

(56) References Cited

U.S. PATENT DOCUMENTS

| | | | |
|---|---|---|---|
| 6,992,439 B2* | 1/2006 | Yamazaki | H01L 27/3246 313/506 |
| 7,105,365 B2* | 9/2006 | Hiroki | H01L 27/1255 257/E27.113 |
| 7,133,100 B2 | 11/2006 | Ahn | |
| 7,301,279 B2* | 11/2007 | Sakakura | H01L 51/5253 313/504 |
| 7,662,011 B2* | 2/2010 | Yamazaki | H01L 51/5253 445/24 |
| 7,674,635 B2* | 3/2010 | Hiroki | G01R 31/2601 438/149 |
| 7,902,740 B2* | 3/2011 | Sakakura | H01L 51/5206 313/506 |
| 8,432,505 B2* | 4/2013 | Akimoto | H01L 51/5215 249/43 |
| 8,651,911 B2* | 2/2014 | Sakakura | H01L 27/1214 313/503 |
| 9,343,514 B2* | 5/2016 | Kim | H01L 27/3246 |
| 10,770,526 B2* | 9/2020 | Kim | H01L 27/3246 |
| 11,004,920 B2* | 5/2021 | Kim | H01L 27/3246 |
| 11,239,296 B2* | 2/2022 | Kim | H01L 27/3246 |
| 11,404,641 B2* | 8/2022 | Sung | H01L 51/56 |
| 2001/0041270 A1* | 11/2001 | Maruyama | H10K 50/171 313/506 |
| 2002/0110940 A1* | 8/2002 | Yamagata | H01L 27/3244 438/22 |
| 2002/0113248 A1* | 8/2002 | Yamagata | H01L 51/56 257/187 |
| 2002/0153831 A1* | 10/2002 | Sakakura | H10K 50/81 313/504 |
| 2006/0035064 A1* | 2/2006 | Hirai | H01L 27/1292 257/E21.414 |
| 2007/0152223 A1* | 7/2007 | Kang | H01L 51/0545 438/149 |
| 2008/0164810 A1* | 7/2008 | Oda | H10K 59/122 445/24 |
| 2008/0206997 A1* | 8/2008 | Fujii | H01L 21/02282 438/694 |
| 2010/0091414 A1* | 4/2010 | Yuasa | H01F 10/3259 427/535 |
| 2010/0108999 A1* | 5/2010 | Mueller | H01L 51/0021 257/E21.414 |
| 2012/0056184 A1* | 3/2012 | Park | H01L 27/3272 438/34 |
| 2014/0319477 A1* | 10/2014 | Kim | H01L 27/3246 438/34 |
| 2018/0090714 A1* | 3/2018 | Kim | H01L 51/0043 |
| 2019/0221622 A1* | 7/2019 | Kim | H01L 27/3246 |
| 2020/0365670 A1* | 11/2020 | Kim | H01L 27/3246 |
| 2021/0376023 A1* | 12/2021 | Cho | H01L 27/3258 |

FOREIGN PATENT DOCUMENTS

| | | | | |
|---|---|---|---|---|
| KR | 10-2009-0076223 A | * | 7/2009 | H01L 21/31144 |
| KR | 1020090076223 A | | 7/2009 | |
| KR | 1020120024241 A | | 3/2012 | |
| KR | 101366610 B1 | | 2/2014 | |
| KR | 10-2016-0108008 A | * | 9/2016 | H01L 2227/32 |
| KR | 1020160108008 A | | 9/2016 | |
| KR | 10-2018-0034039 A | * | 4/2018 | C23C 14/12 |
| KR | 101895444 B1 | | 9/2018 | |
| KR | 101943687 B1 | | 1/2019 | |

OTHER PUBLICATIONS

Machine translation, Kim, Korean Pat. Pub. No. KR2018-0034039A, translation date: Sep. 3, 2022, Espacenet, all pages. (Year: 2022).*

Machine translation, Shim, Korean Pat. Pub. No. KR2009-0076223A, translation date: Sep. 3, 2022, Espacenet, all pages. (Year: 2022).*

Machine translation, Choi, Korean Pat. Pub. No. KR2016-0108008A, translation date: Sep. 3, 2022, Espacenet, all pages. (Year: 2022).*

* cited by examiner

DISPLAY DEVICE AND MANUFACTURING METHOD THEREOF

This application claims priority to Korean Patent Application No. 10-2020-0066613, filed on Jun. 2, 2020, and all the benefits accruing therefrom under 35 U.S.C. § 119, the contents of which in their entirety are herein incorporated by reference.

BACKGROUND

(a) Technical Field

This disclosure relates to a display device and a manufacturing method thereof.

(b) Description of the Related Art

An emissive display device may include light emitting diodes ("LEDs") corresponding to pixels, and may display an image by controlling luminance of each of the light emitting diodes. Unlike a light-receiving type display device such as a liquid crystal display, the emissive display device may not require a separate light source so as to reduce thickness and weight thereof. In addition, the emissive display device has characteristics such as high luminance, high contrast ratio, high color reproduction, high response speed, and the like, to display a high quality image.

Due to such merits, the emissive display device is applied to various electronic devices including mobile devices such as smart phones and tablets, monitors, televisions, and the like, and has been in the spotlight as a display device for vehicles.

SUMMARY

Embodiments provide a display device with improved reliability.

A manufacturing method of a display device according to an embodiment includes: forming a transistor on a substrate; forming an organic insulating layer on the transistor; and performing a plasma treatment on the organic insulating layer. The organic insulating layer includes an acryl-based polymer, and the plasma treatment is performed by using helium gas or argon gas.

Single and double bonds of carbon and oxygen in the organic insulating layer may be broken by the plasma treatment.

A methane content may increase in the organic insulating layer by the plasma treatment.

The organic insulating layer may define an opening, and the manufacturing method may further include forming a light emission member of a light emitting diode overlapping the opening in a plan view after the performing of the plasma treatment.

The method may further include forming a first electrode of a light emitting diode on the organic insulating layer after the performing of the plasma treatment.

The method may further include forming a connection electrode connected to the transistor through a contact hole defined in the organic insulating layer after the performing of the plasma treatment.

The plasma treatment may be performed at a process temperature of about 200 (degrees in Celsius) ° C. to about 300° C.

The plasma treatment may be performed at a process pressure of about 10 millitorrs (mT) to about 200 mT.

The plasma treatment may be performed at a source power of about 500 watts (W) or more and a process power of a bias power of about 0 W or more.

The plasma treatment may be performed for a process time of about 15 seconds or more.

A manufacturing method of a display device according to an embodiment includes: forming a transistor on a substrate; forming an organic insulating layer including an acryl-based polymer on the transistor; and performing a plasma treatment on the organic insulating layer. The plasma treatment is performed using only helium gas or argon gas, and single or double bonds of carbon and oxygen in the organic insulating layer are broken by the plasma treatment.

A display device according to an embodiment includes: a substrate; a transistor disposed on the substrate; a first insulating layer disposed on the transistor; a first electrode disposed on the first insulating layer and electrically connected to the transistor, where the first electrode is included in a light emitting diode; a second insulating layer disposed on the first insulating layer to define an opening overlapping the first electrode in a plan view; a light emission member disposed on the first electrode, wherein the light emission member is included in the light emitting diode; and a second electrode disposed on the light emission member, wherein the second electrode is included in the light emitting diode. At least one of the first insulating layer and the second insulating layer may be an organic insulating layer containing an acryl-based polymer, and single and double bonds of carbon and oxygen in the organic insulating layer are broken.

According to the embodiments, even when the acryl-based polymer is used for the organic insulating layer of the display panel, outgas may be reduced and a reliable display device can be provided. As the acryl-based polymer is used, it is possible to reduce a manufacturing cost.

DETAILED DESCRIPTION

Figure 1:
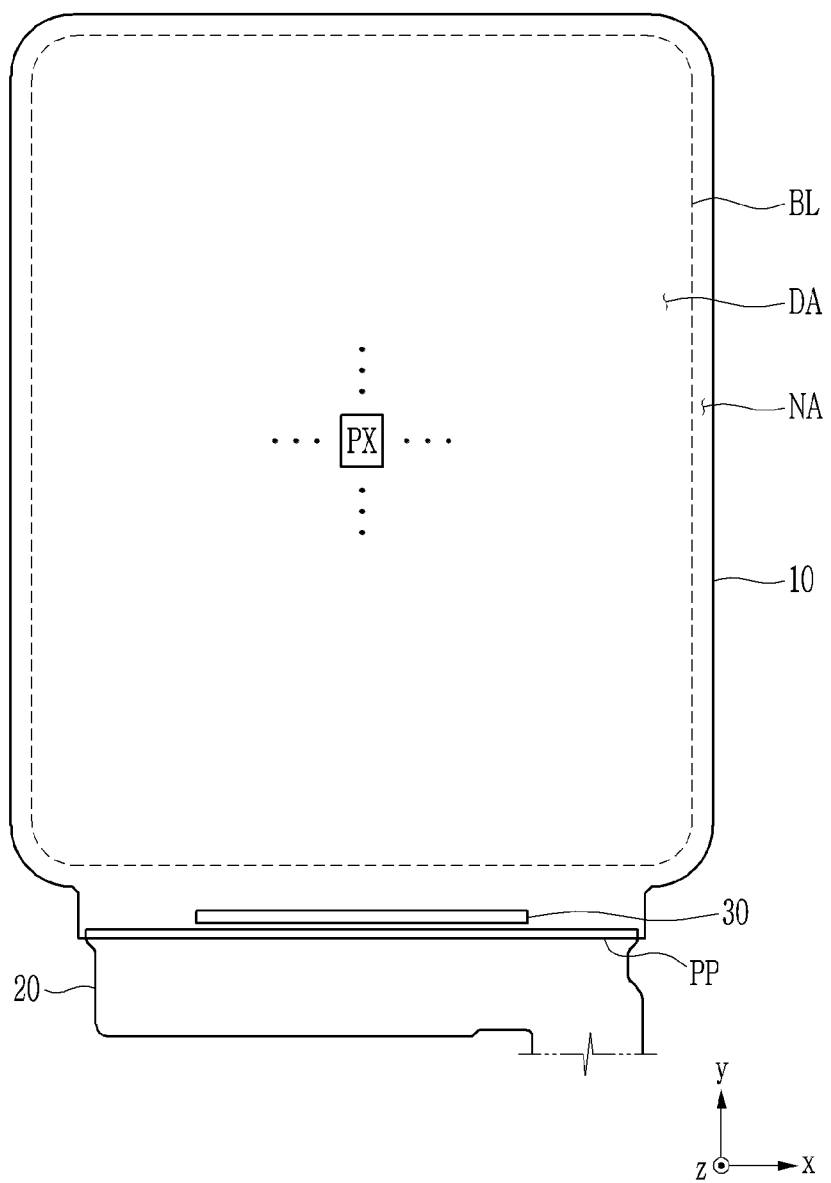
FIG. 1 illustrates a schematic top plan view of a display device according to an embodiment.

The inventive concept will be described more fully hereinafter with reference to the accompanying drawings, in which embodiments are shown.

Further, size and thicknesses of constituent elements shown in the accompanying drawings are arbitrarily given for better understanding and ease of description.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

In addition, unless explicitly described to the contrary, the word "comprise" and variations such as "comprises" or "comprising" will be understood to imply the inclusion of stated elements but not the exclusion of any other elements.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In addition, in the specification, when a part "includes" a certain component, this means that other components may be further included unless specifically stated to the contrary.

In the drawings, a reference character x is used for indicating a first direction, y is used for indicating a second direction that is perpendicular to the first direction, and z is used for indicating a third direction that is perpendicular to the first direction and the second direction. The first direction x, the second direction y, and the third direction z may correspond to a horizontal direction, a vertical direction, and a thickness direction of the display device, respectively.

Unless otherwise described in the specification, "overlapping" indicates overlapping in a plan view, and indicates overlapping in the third direction z.

A display device according to embodiments will now be described with reference to the accompanying drawings by taking an emissive display device as an example.

FIG. 1 illustrates a schematic top plan view of a display device according to an embodiment.

Referring to FIG. 1, the display device includes a display panel 10, a flexible printed circuit film 20 bonded to the display panel 10, and a driving unit including an integrated circuit chip 30, etc.

The display panel 10 includes a display area DA corresponding to a screen on which an image is displayed and a non-display area NA. Circuits and/or signal lines for generating and/or transferring various signals and voltages applied to the display area DA are disposed in the non-display area NA. The non-display area NA may be positioned to surround a periphery of the display area DA. In FIG. 1, the inside and outside of a dotted-line boundary line BL correspond to the display area DA and the non-display area NA, respectively.

Pixels PX are disposed in a matrix form in the display area DA of the display panel 10. Signal lines such as a gate line (also referred to as a scan line), a data line, and a driving voltage line may also be disposed in the display area DA. Each of the pixels PX may be connected with the gate line, the data line, the driving voltage line, and the like to receive a gate signal (also referred to as a scan signal), a data signal, a driving voltage, and the like.

A touch sensor for detecting a user's touch and/or a non-contact touch may be disposed in the display area DA. Although the display area DA having a substantially rectangular shape is illustrated, the display area DA may have various shapes such as a polygonal shape, a circular shape, an elliptical shape, and the like in another embodiment.

A pad portion PP in which pads for receiving signals from the outside of the display panel 10 are disposed may be disposed in the non-display area NA of the display panel 10. The pad portion PP may be disposed to extend in a first direction x along one edge of the display panel 10. The flexible printed circuit film 20 may be bonded to the pad portion PP, and pads of the flexible printed circuit film 20 may be electrically connected to the pads of the pad portion PP.

The driving unit may be disposed in the non-display area NA of the display panel 10 to generate and/or process various signals for driving the display panel 10. The driving unit may include a data driver for applying a data signal to the data line, a gate driver for applying a gate signal to the gate line, and a signal controller for controlling the data driver and the gate driver. The pixels PX may receive the data signal at predetermined timing depending on the gate signal generated by the gate driver. The gate driver may be integrated in the display panel 10, and may be disposed on at least one side of the display area DA. The data driver and the signal controller may be provided as an integrated circuit chip (also referred to as a driving "IC" chip) 30, and the integrated circuit chip 30 may be mounted in the non-display area NA of the display panel 10. The integrated circuit chip 30 may be mounted on the flexible printed circuit film 20 or the like to be electrically connected to the display panel 10.

A display device according to an embodiment will be described with reference to FIG. 2 based on the display area DA of the display panel 10.

Figure 2:
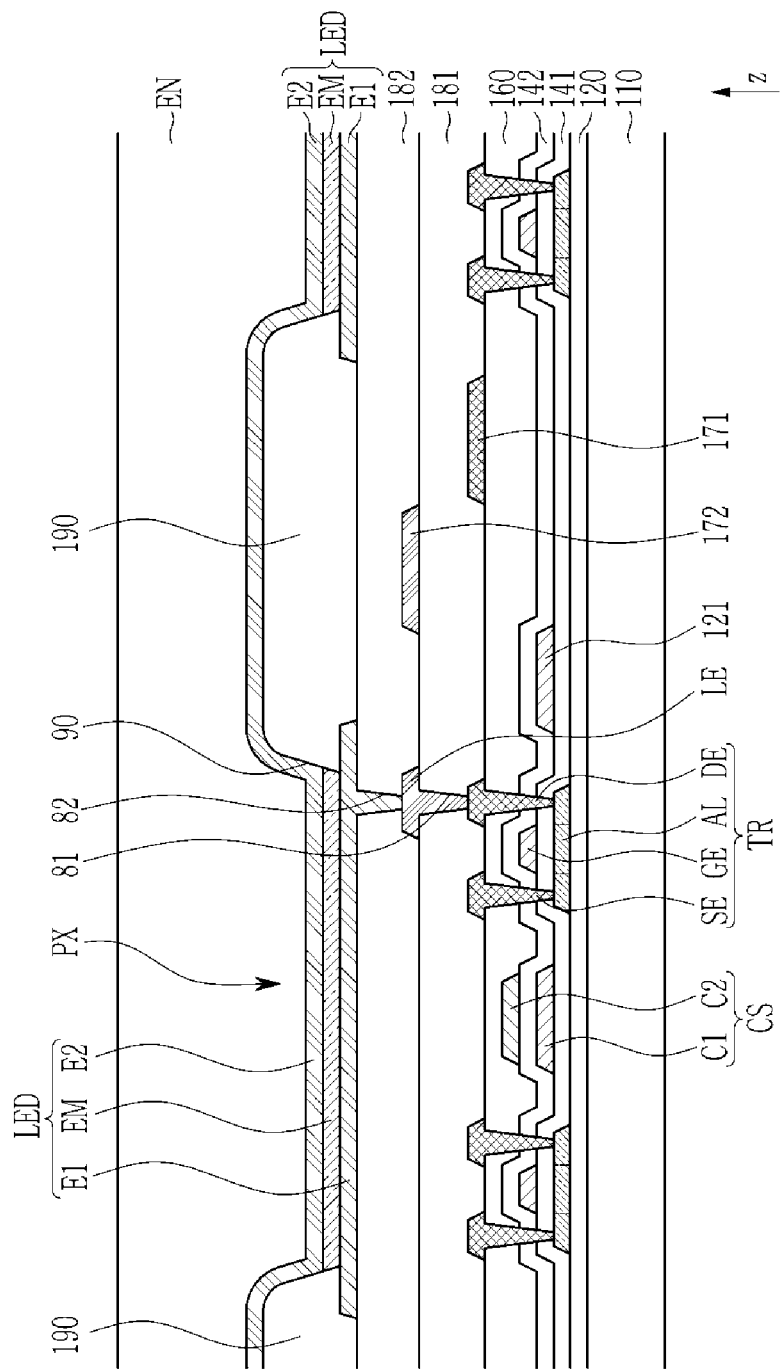
FIG. 2 illustrates a schematic cross-sectional view of a display device according to an embodiment.

FIG. 2 illustrates a schematic cross-sectional view of a display device according to an embodiment. FIG. 2 schematically illustrates a cross-section of one pixel area and an adjacent area.

Referring to FIG. 2, the display panel 10 may have a structure in which several layers, wires, and elements are stacked on a substrate 110 to configure and drive the pixels PX.

The substrate 110 may include or be made of an insulating material such as glass or plastic. The substrate 110 may include at least one barrier layer for preventing penetration of moisture, etc. from the outside, and the barrier layer may be an inorganic insulating material such as a silicon oxide ($SiO_x$) and a silicon nitride ($SiN_x$).

A buffer layer 120 may be disposed on the substrate 110. The buffer layer 120 may block impurities that may diffuse from the substrate 110 to a semiconductor layer AL, and may reduce stress applied to the substrate 110 in a process of forming the semiconductor layer AL. The buffer layer 120 may include an inorganic insulating material such as a silicon oxide and a silicon nitride.

The semiconductor layer AL of a transistor TR may be disposed on the buffer layer 120. The semiconductor layer AL may include a channel region that overlaps a gate electrode GE of the transistor TR, and a source region and a drain region positioned at opposite sides of the channel region. The semiconductor layer AL may include polysilicon, amorphous silicon, or an oxide semiconductor.

An insulating layer 141, which may be referred to as a first gate insulating layer, may be disposed on the semiconductor layer AL. The insulating layer 141 may include an inorganic insulating material such as a silicon oxide and a silicon nitride.

A first gate conductor may include a gate line 121, the gate electrode GE, and a first electrode C1 of a storage capacitor CS. The first gate conductor may be disposed on the insulating layer 141. The first gate conductive layer may include a metal such as molybdenum (Mo), copper (Cu), aluminum (Al), silver (Ag), chromium (Cr), tantalum (Ta), titanium (Ti), or an alloy thereof. A first gate conductor may be a single layer or a multilayer.

An insulating layer 142, which may be referred to as a second gate insulating layer, may be disposed on the insulating layer 141 and the first gate conductor. The insulating layer 142 may include an inorganic insulating material such as a silicon oxide and a silicon nitride.

A second gate conductor may include a second electrode C2 of a storage capacitor CS and the like. The second gate conductor may be disposed on the insulating layer 142. The second gate conductive layer may include a metal such as molybdenum (Mo), copper (Cu), aluminum (Al), silver (Ag), chromium (Cr), tantalum (Ta), titanium (Ti), or an alloy thereof. A second gate conductor may be a single layer or a multilayer.

An insulating layer 160, which may be referred to as an interlayer-insulating layer, may be disposed on the insulating layer 142 and the second gate conductor. The insulating layer 160 may include an inorganic insulating material such as a silicon oxide and a silicon nitride.

A first data conductor may include a data line 171, and a source electrode SE and a drain electrode DE of the transistor TR. The first data conductor may be disposed on the insulating layer 160. The source electrode SE and the drain electrode DE may be connected to a source region and a drain region of the semiconductor layer AL, respectively, through contact holes defined in the insulating layers 141, 142, and 160. The first data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. A first data conductor may be a single layer or a multilayer.

The gate electrode GE, the source electrode SE, and the drain electrode DE constitute the transistor TR together with the semiconductor layer AL. In view of the circuit, the gate electrode GE may indicate a control terminal of the transistor TR, one of the source electrode SE and the drain electrode DE may indicate an input terminal, and the other of the source electrode SE and the drain electrode DE may indicate an output terminal. The transistor TR in FIG. 2 may be referred to as a top-gate transistor because the gate electrode GE is disposed above the semiconductor layer AL. The transistor IR may be a bottom-gate transistor in which the gate electrode is disposed below the semiconductor, or may be a vertical transistor in which the source electrode and the drain electrode overlap in another embodiment.

An insulating layer 181, which may be referred to as a first planarization layer, may be disposed on the insulating layer 160 and the data conductor.

A second data conductor may include a connection electrode LE, a driving voltage line 172, and the like. The second data conductor may be disposed on the insulating layer 181. The connection electrode LE may be connected to the drain electrode DE of the transistor 1R through a contact hole 81 defined in the insulating layer 181. The second data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or a metal alloy thereof. A second data conductor may be a single layer or a multilayer.

An insulating layer 182, which may be referred to as a second planarization layer, may be disposed on the second data conductor.

The insulating layer 181 may insulate the first data conductor from the second data conductor. The insulating layer 181 and the insulating layer 182 may planarize a surface on which the light emitting diode LED is to be formed, in order to increase light emitting efficiency of the light emitting diode LED to be formed on the insulating layer 182. The insulating layer 181 and the insulating layer 182 may include an organic insulating material such as an acrylic polymer, a siloxane polymer, or an imide polymer. The insulating layer 181 and the insulating layer 182 may be referred to as an organic insulating layer.

An acryl-based polymer may be referred to as an acryl resin or acryl. The acryl-based polymer may include polymethyl methacrylate, polyacrylic acid, polymethacrylate, polyacrylonitrile, or the like.

When the insulating layer 181 is formed of an organic insulating material, the insulating layer 181 may be formed by coating and curing a polymer solution including a material such as a solvent, an initiator, a binder, and the like. After the insulating layer 181 is formed, remaining materials or decomposed materials in the insulating layer 181 may be discharged as a gas in a subsequent process and/or during use of the display device. This phenomenon is referred as outgasing. The discharged gas (outgas) may propagate to the pixel PX to denature or deteriorate a light emission member EM and/or a second electrode E2 of the pixel PX (e.g., to oxidize the second electrode E2), which may cause shrinkage to reduce an emission area of the pixel PX.

An imide-based polymer such as a polyimide is usually more expensive than an acrylic polymer. Therefore, a cost may be reduced by using an acrylic polymer than when using an imide polymer as an organic insulating layer. However, there is a problem that an outgas increases (e.g., by 3 times or more) in the organic insulating layer including the acrylic polymer compared to the organic insulating layer including the imide polymer. According to an embodiment, even when the insulating layer 181 includes the acrylic polymer, an amount of outgas may be significantly reduced by forming the insulating layer 181 and then performing a helium (He) plasma treatment or an argon (Ar) plasma treatment. A gas used for the helium plasma treatment may include only helium gas. A gas used for the argon plasma treatment may include only argon gas.

Similarly, the insulating layer 182 may be an organic insulating layer including the acryl-based polymer, and after formation of the insulating layer 182, the helium plasma treatment or the argon plasma treatment on the insulating layer 182 may significantly reduce the amount of outgas.

The display panel 10 may not include a second data conductor, and in this case, one planarization layer may be disposed above the first conductor. The driving voltage line 172 may be formed at the same layer by using the same process as for the data line 171. The insulating layer 181 may be an inorganic insulating layer including an inorganic insulating material, and may be referred to as a passivation layer.

The first electrode E1 of the light emitting diode LED is disposed on the insulating layer 182. In view of the pixels, the first electrode E1 may be referred to as a pixel electrode. The first electrode E1 may be connected to the connection electrode LE through a contact hole 82 defined in the insulating layer 182. Since the connection electrode LE is connected to the drain electrode DE, the first electrode E1 may be electrically connected to the drain electrode DE through the connection electrode LE. The first electrode E1 may be directly connected to the drain electrode DE. The transistor TR to which the first electrode E1 is connected may be a driving transistor or a light emission control transistor that is electrically connected to the driving transistor. The first electrode E1 may include a metal such as silver (Ag), nickel (Ni), gold (Au), platinum (Pt), aluminum (Al), copper (Cu), aluminum neodium (AlNd), aluminum nickel lanthanum (AlNiLa), or a metal alloy. The first electrode E1 may include a transparent conductive material such as an indium tin oxide ("ITO") or an indium zinc oxide ("IZO").

An insulating layer 190 defining an opening 90 overlapping the first electrode E1 in a plan view may be disposed on the insulating layer 182. The opening 90 of the insulating layer 190 may define an area corresponding to the emission area of each pixel PX, and the insulating layer 190 may be referred to as a pixel definition layer. The insulating layer 190 may be an organic insulating layer including an organic insulating material such as an acryl-based polymer, an imide-based polymer, and an amide-based polymer. The insulating layer 190 may include an acryl-based polymer, and in this case, the insulating layer 190 may be treated with helium plasma or argon plasma in order to ameliorate outgasing.

The light emission member EM may be disposed on the first electrode E1. The light emission member EM includes a light emission layer, and may include at least one of a hole injection layer, a hole transport layer, an electron transport layer, and an electron injection layer.

The second electrode E2 may be disposed on the light emission member EM. The second electrode E2 may be disposed monolithically over several pixels, and the second electrode E2 may be referred to as a common electrode in view of the pixels. The second electrode E2 may be electrically connected to a common voltage transferer which transfers the common voltage. The second electrode E2 may include or be made of a low work function metal such as calcium (Ca), barium (Ba), magnesium (Mg), aluminum (Al), and silver (Ag) as a thin layer to have light transmittance. The second electrode E2 may include or be formed of a transparent conductive material such as ITO or IZO.

The first electrode E1, the light emission member EM, and the second electrode E2 of each of the pixels PX may form a light emitting diode LED, which may be an organic light emitting diode ("OLED"). Each pixel PX may include a corresponding light emitting diode LED. The first electrode E1 may be an anode which is a hole injection electrode and the second electrode E2 may be a cathode which is an electron injection electrode, or vice versa. When holes and electrons are injected from the first electrode E1 and the second electrode E2, respectively, into the light emission member EM, excitons formed by combining the injected holes and electrons are emitted when they fall from an excited state to a ground state.

An encapsulation layer EN may be disposed on the second electrode E2. The encapsulation layer EN may encapsulate a light emitting diode LED to prevent moisture or oxygen from penetrating from the outside. The encapsulation layer EN may be a thin film encapsulation layer including one or more inorganic layers and one or more organic layers which are stacked on the second electrode E2. The encapsulation layer EN may be provided in a form of a substrate.

A manufacturing method of a display device according to an embodiment will now described with reference to FIG. 3 to FIG. 9.

Figure 3:
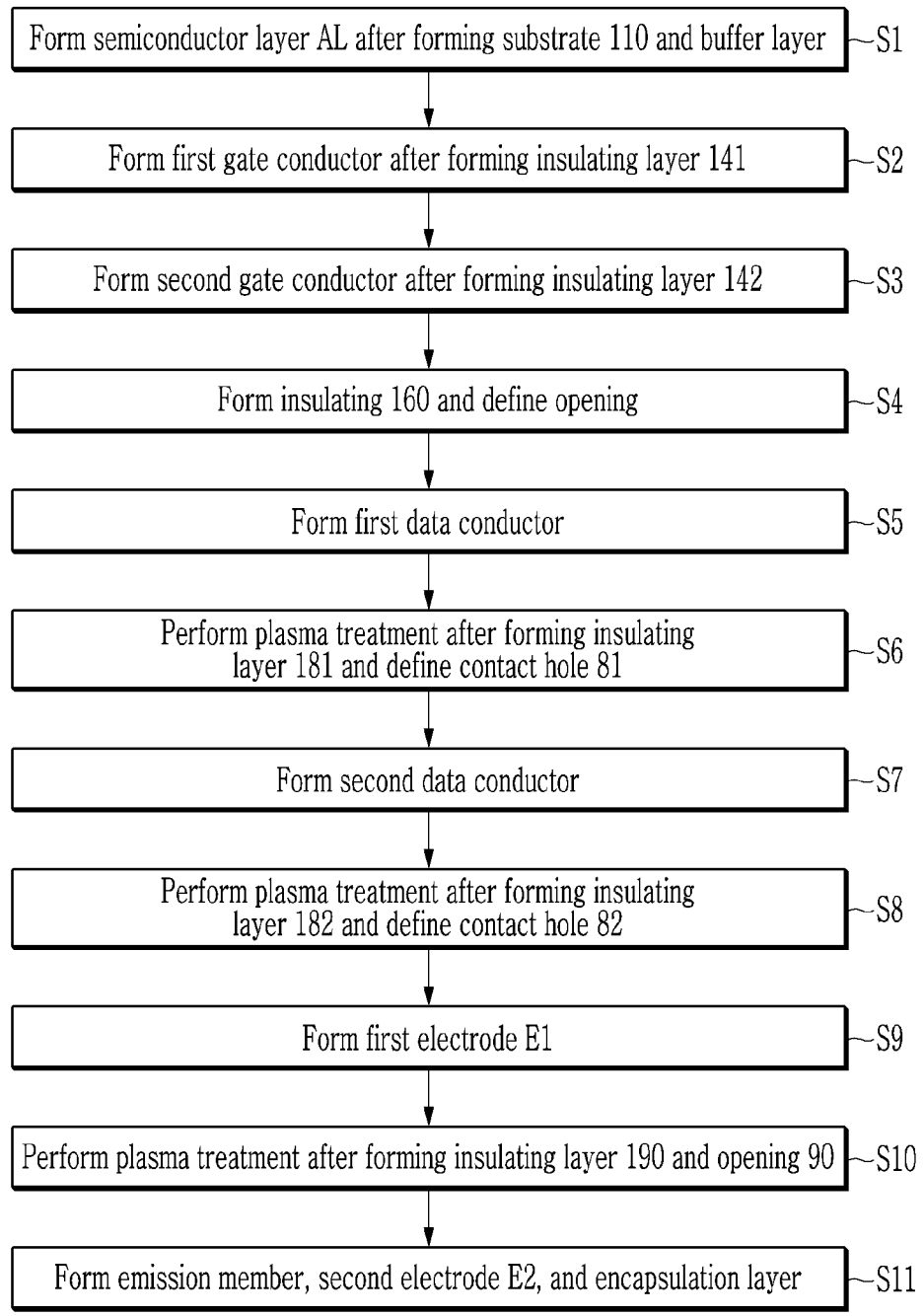
FIG. 3 is a flowchart illustrating a manufacturing method of a display device according to an embodiment.

FIG. 3 is a flowchart illustrating a manufacturing method of a display device according to an embodiment, and FIG. 4, FIG. 5, FIG. 6, FIG. 7, FIG. 8, and FIG. 9 illustrate cross-sectional views showing a manufacturing method of a display device according to an embodiment. FIG. 3 is mainly focused on steps using a photolithography process, and FIG. 4 to FIG. 9 show process steps after forming the transistor TR.

Figure 4:
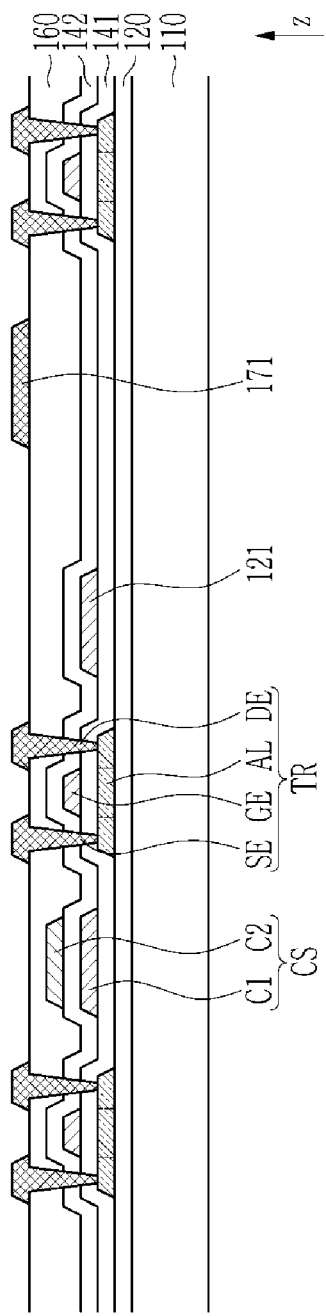
FIG. 4, FIG. 5, FIG. 6, FIG. 7, FIG. 8, and FIG. 9 illustrate cross-sectional views showing a manufacturing method of a display device according to an embodiment.

Referring to FIG. 3 and FIG. 4, the buffer layer 120 is formed on the substrate 110 through chemical vapor deposition or the like, and a semiconductor layer AL is formed on the buffer layer 120 (S1). The buffer layer 120 includes or is formed of an inorganic insulating material. The semiconductor layer AL may be formed by forming a semiconductor material layer on the buffer layer 120 through chemical vapor deposition or the like, and patterning the semiconductor material layer using the photolithography process. Hereinafter, patterning by the photolithography process using a photoresist and a mask is simply referred to as patterning.

The insulating layer 141 is formed on the semiconductor layer AL and the buffer layer 120. The first gate conductor is formed on the insulating layer 141 (S2). The insulating layer 141 includes or is formed of an inorganic insulating material, and the first gate conductor may include the gate line 121, the gate electrode GE, and the first electrode C1 of the storage capacitor CS. The first gate conductor may be formed by forming a conductive layer on the insulating layer 141 through sputtering or the like and patterning it.

The insulating layer 142 may include or be formed of an inorganic insulating material on the first gate conductor and the insulating layer 141. The second gate conductor is disposed on the insulating layer 142 (S3). The second gate conductor may include the second electrode C2 of the storage capacitor CS. The second gate conductor may be formed by forming a conductive layer on the insulating layer 142 and patterning it.

The insulating layer 160 is formed on the second gate conductor and the insulating layer 142. The insulating layers 141, 142, and 160 are patterned to define openings that overlap the source region and the drain region of the semiconductor layer AL (S4) in a plan view. The insulating layer 160 includes or is formed of an inorganic insulating material.

The first data conductor is formed by forming a conductive layer on the insulating layer 160 and patterning the conductive layer (S5). The first data conductor may include the data line 171, and the source electrode SE and the drain electrode DE of the transistor TR. The source electrode SE and the drain electrode DE may be connected to a source region and a drain region of the semiconductor layer AL, respectively, through contact holes defined in the insulating layers 141, 142, and 160.

Figure 5:
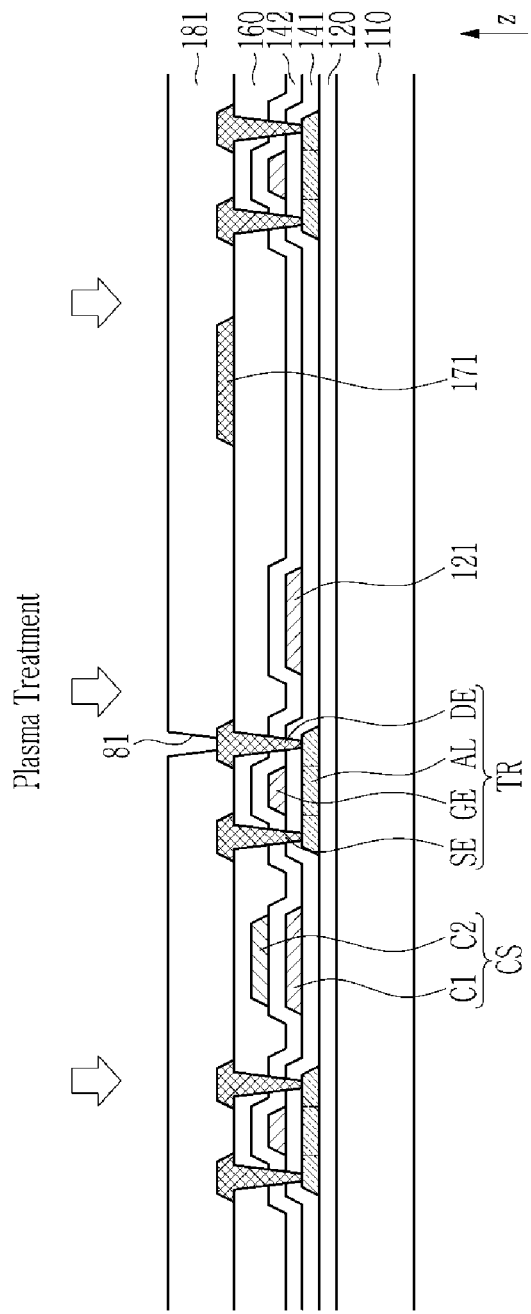

Referring to FIG. 3 and FIG. 5, an insulating layer 181 is formed on the first data conductor and the insulating layer 160. The contact hole 81 overlapping the drain electrode DE in a plan view is defined by patterning the insulating layer 181 (S6). The insulating layer 181 includes or is formed of an organic insulating material. When the organic insulating material is the acryl-based polymer, the helium plasma treatment or the argon plasma treatment is performed to reduce outgasing (S6).

A reason why the outgas is reduced by the plasma treatment is because outgas diffusion is reduced due to surface hardening of the organic insulating layer by an ion bombardment effect. In addition, due to the ultraviolet radiation effect, a surface and an interior of the organic insulating layer is cured to reduce a source of the outgas. Since short wavelength emission of helium gas has high energy, the helium plasma treatment may be more advantageous than the argon plasma treatment. The short-wavelength emission of helium gas may break both single and double bonds of carbon (C) and oxygen (O), thereby reducing oxygen and carbon on the surface and in the interior of the organic insulating layer. For example, in a helium spectrum, very low wavelengths of about 51.6 nanometers (nm) and about 59.1 nm were identified, and when converted to energy, were about 24.0 electron-volts (eV) and about 20.9 eV, respectively. This may be sufficient to break bonds of C—O and C=O with binding energies of 3.7 eV and 8.3 eV, respectively.

The plasma treatment may be performed in an etching apparatus or a plasma generating apparatus, including a process chamber. A process gas used in the plasma treatment may contain only helium or only argon. As a non-limiting example, a process temperature of the plasma treatment may be in a range of about 200 degrees in Celsius (° C.) to about 300° C., e.g., about 230° C. to about 250° C., which is an appropriate curing temperature for the acrylic polymer. A process pressure may be in a range of about 10 millitorrs (mT) to about 200 mT, e.g., about 10 mT to about 150 mT. The process power may have a source power of about 500 watts (W) or more, e.g., about 500 W to about 1000 W, and a bias power of about 0 W or more, e.g., about 0 W to about 1000 W. The process time may be in a range of about 15 seconds (s) or more, e.g., about 15 s to about 120 s.

Figure 6:
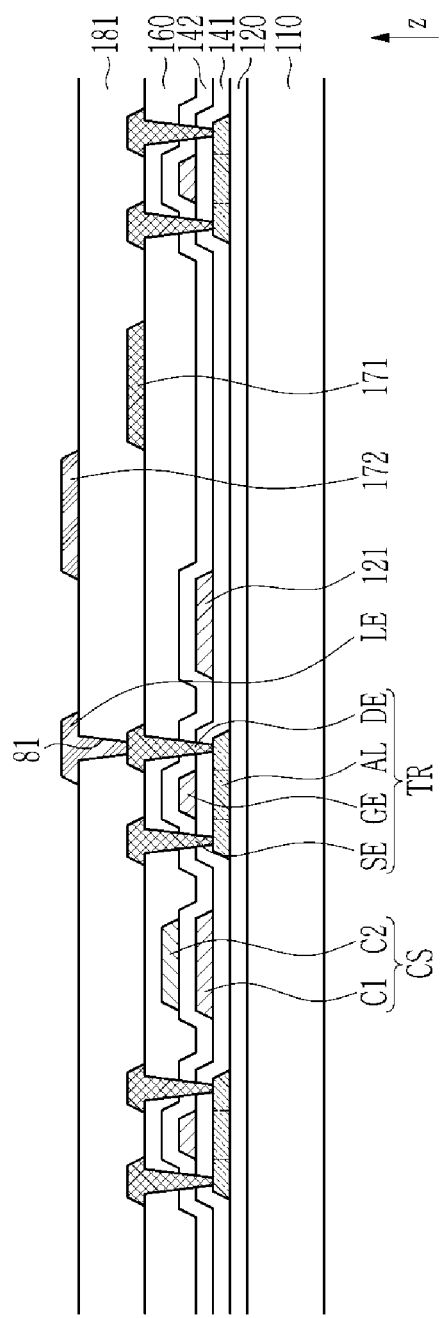

Referring to FIG. 3 and FIG. 6, the second data conductor is formed by forming a conductive layer on the insulating layer 181 and patterning it (S7). The second data conductor may include a connection electrode LE, a driving voltage line 172, and the like. The connection electrode LE may be connected to the drain electrode DE through the contact hole 81 defined in the insulating layer 181.

Figure 7:
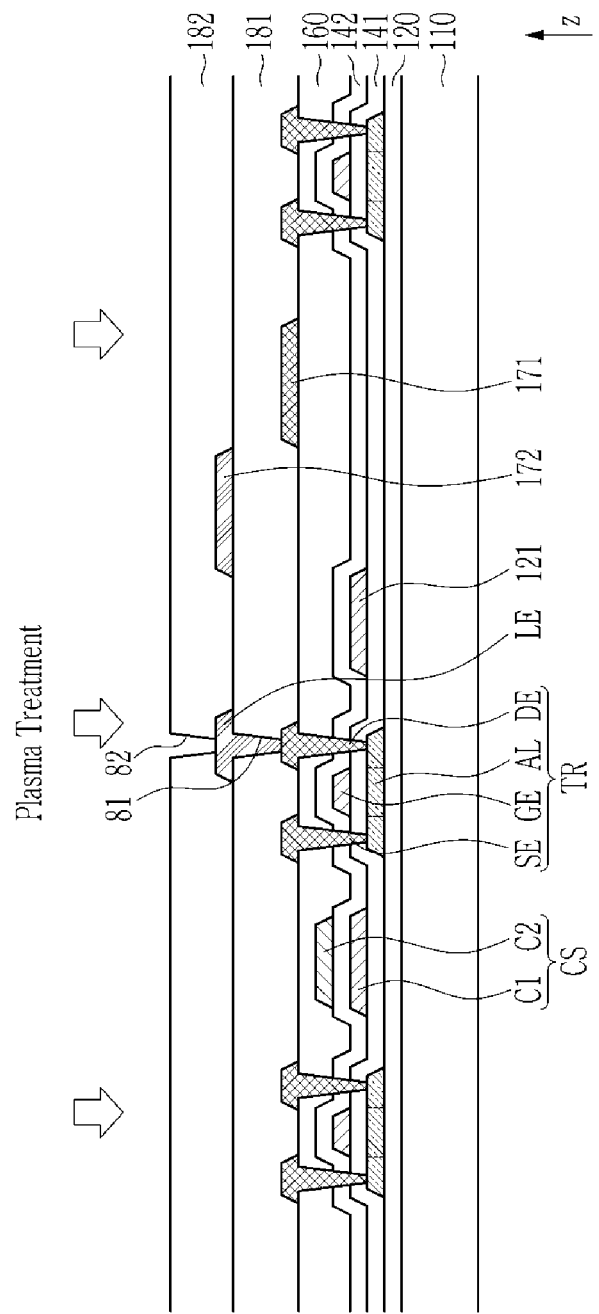

Referring to FIG. 3 and FIG. 7, the insulating layer 182 is formed on the first data conductor and the insulating layer 181. The contact hole 82 overlapping the connection electrode LE in a plan view is defined by patterning the insulating layer 182 (S8). The insulating layer 182 include or is formed of an organic insulating material. When the organic insulating material is the acryl-based polymer, as described above, the helium plasma treatment or the argon plasma treatment is performed to reduce outgasing (S8).

Figure 8:
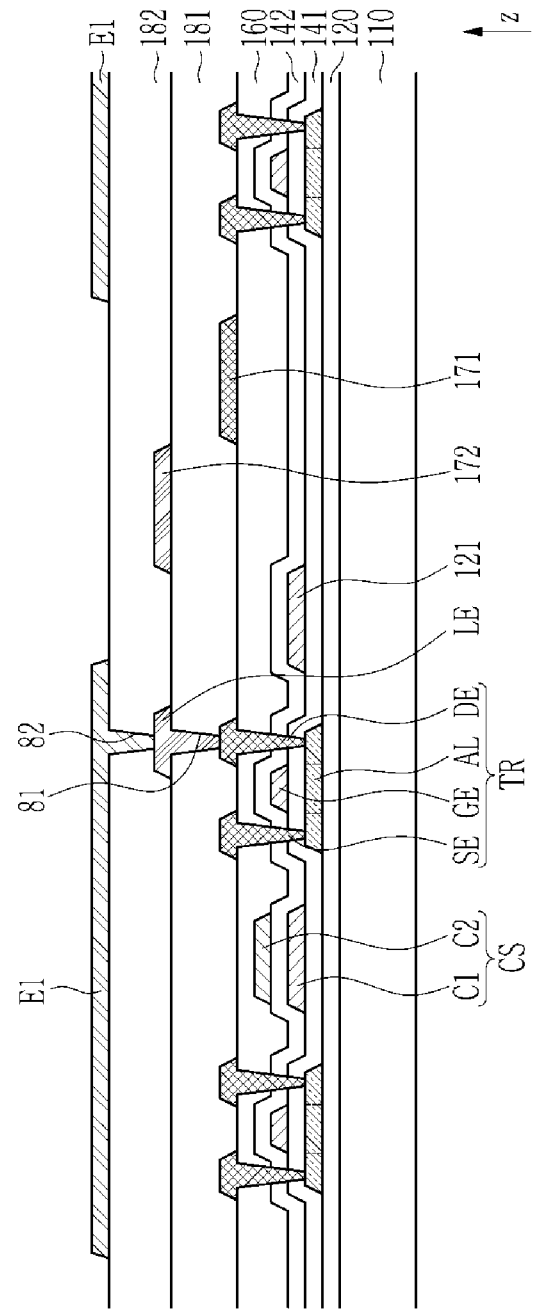

Referring to FIG. 3 and FIG. 8, the first electrode E1 may be formed by forming a conductive layer on the insulating layer 182 and patterning the conductive layer (S9). The first electrode E1 may be connected to the connecting electrode LE through the contact hole 82 defined in the insulating layer 182, to be electrically connected to the drain electrode DE.

Figure 9:
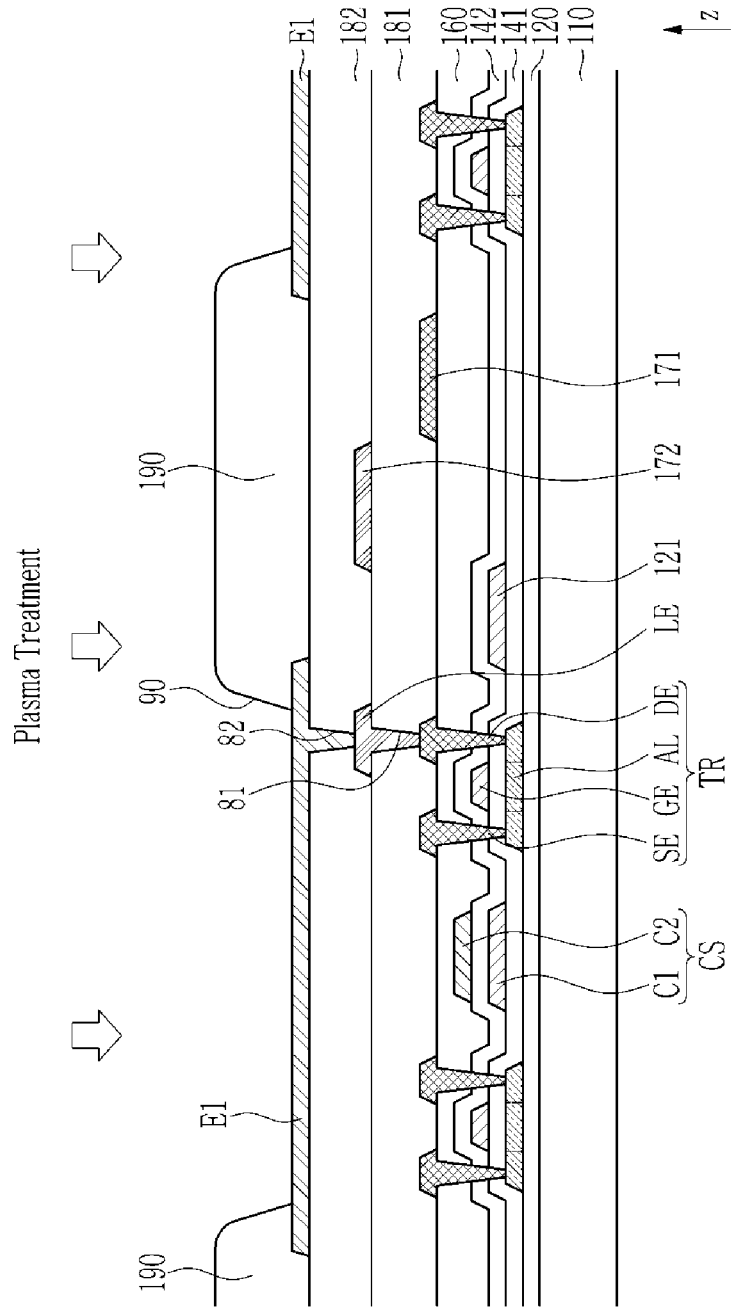

Referring to FIG. 3 and FIG. 9, a space for an opening 90 overlapping the first electrode E1 is formed by forming the insulating layer 190 on the first electrode E1 and the insulating layer 182, and patterning the insulating layer 190 (S10). The insulating layer 190 is formed using an organic insulating material. When the organic insulating material is the acryl-based polymer, as described above, the helium plasma treatment or the argon plasma treatment is performed to reduce outgasing (S10).

Referring to FIG. 2 again, the light emission member EM overlapping the opening 90 of the insulating layer 190 in a plan view is formed, and the second electrode E2 is formed on the light emission member EM and the insulating layer 190 (S11). In the opening 90, the light emission member EM may contact the first electrode E1 and the second electrode E2. Thereafter, the display panel 10 having the same cross-sectional structure as illustrated in FIG. 2 may be manufactured by forming the encapsulation layer EN for sealing the light emitting diode LED (S11).

Figure 10:
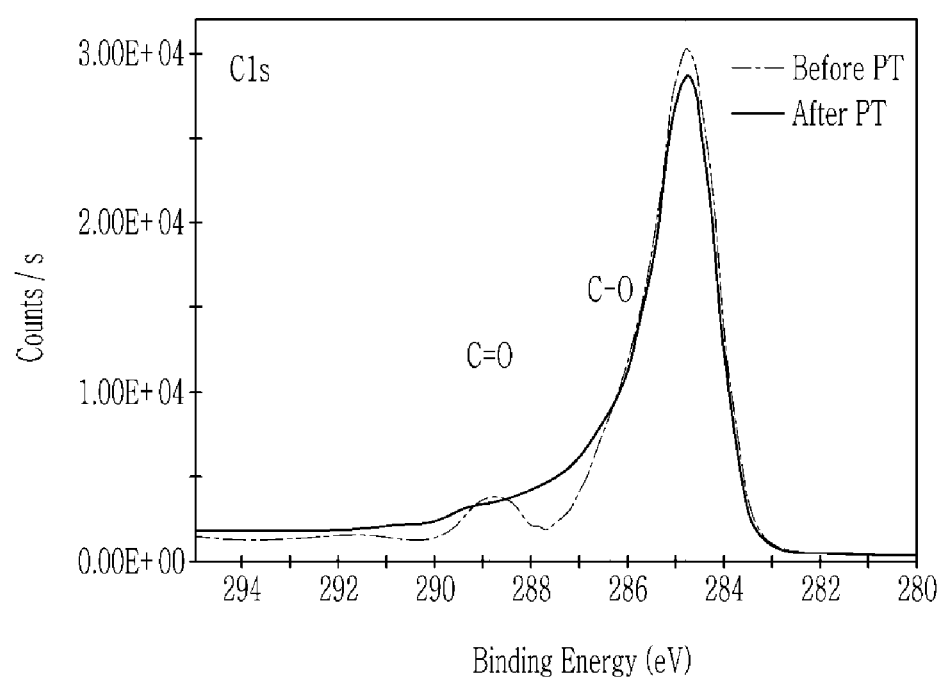
FIG. 10 and FIG. 11 illustrate graphs showing analysis results before and after a helium plasma treatment on an organic insulating layer, respectively.
Figure 11:
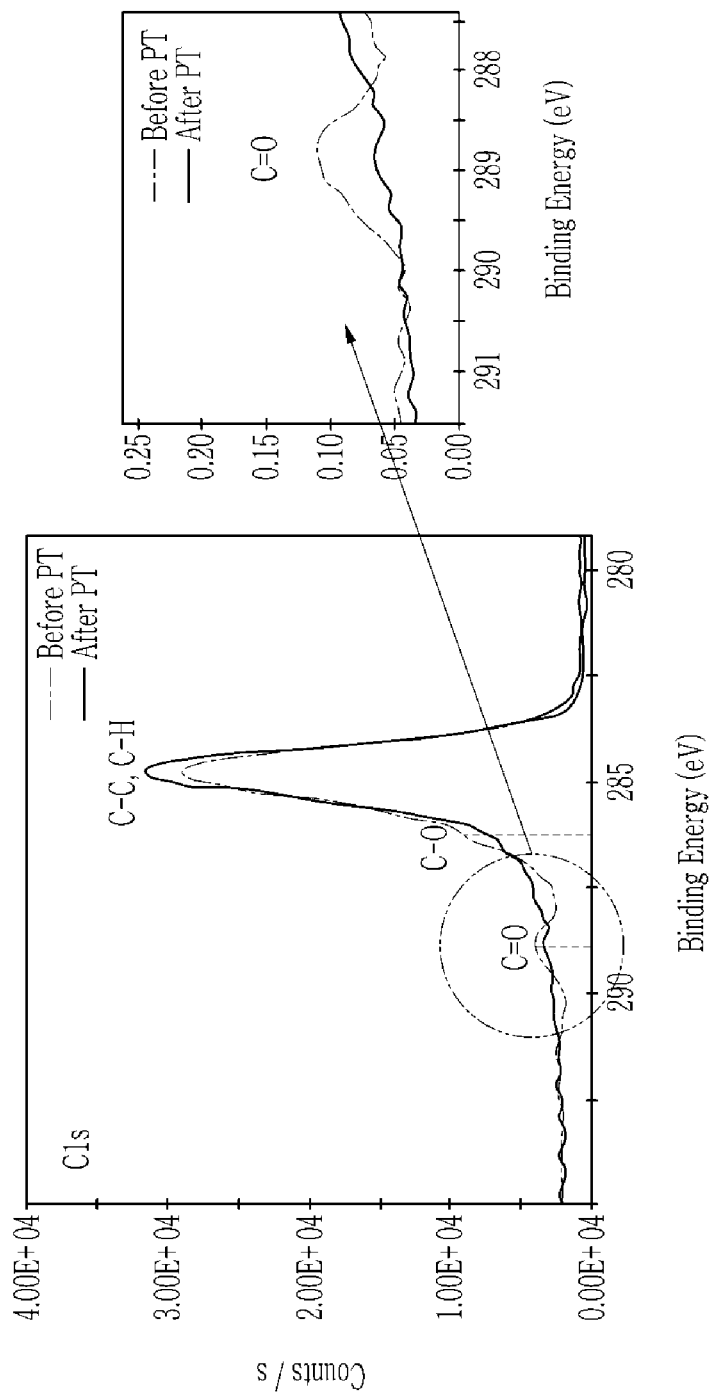

FIG. 10 and FIG. 11 illustrate graphs showing analysis results before and after a helium plasma treatment PT on an organic insulating layer. In this example, the organic insulating layer was formed using an acryl-based polymer (hereinafter referred to as an acryl), having a product name SOJP-290 of Dongjin Semichem Co., Ltd. Hereinafter, even when there is no special mention, all test results for the organic insulating layer are for the organic insulating layer formed using acryl of the same product of the same company.

FIG. 10 illustrates a result of analyzing a surface of the organic insulating layer by X-ray photoelectron spectroscopy, and FIG. 11 shows a result of analyzing an interior of the organic insulating layer by X-ray photoelectron spectroscopy. Referring to FIG. 10, the bonds of C—O and C=O both decreased after the helium plasma treatment compared to before the helium plasma treatment on a surface of the organic insulating layer. Referring to FIG. 11, the bonds of C—O and C=O were reduced more dramatically after the helium plasma treatment in the organic insulating layer. This result may support the reduction of an outgas source in the organic insulating layer by the helium plasma treatment.

Figure 12:
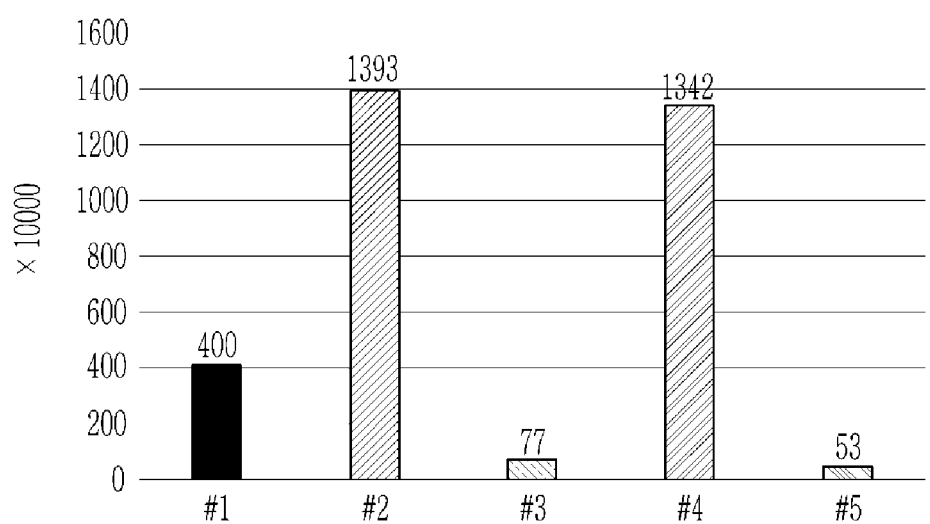
FIG. 12 illustrates a graph showing a reduction in a total amount of outgas depending on a plasma treatment in an organic insulating layer.

FIG. 12 illustrates a graph showing a reduction in a total amount of outgas depending on the helium plasma treatment in an organic insulating layer.

Referring to FIG. 12, Test Example 1 (#1) shows a total amount of outgas in an organic insulating layer formed by coating a photosensitive polyimide (hereinafter referred to as a polyimide) and curing it at about 250° C. Test Example 2 (#2) shows the total amount of outgas in the organic insulating layer formed by coating the acryl and curing it at about 250° C., and Test Example 3 (#3) shows the total amount of outgas after the helium plasma treatment on the organic insulating layer formed under the same material and conditions as in Test Example 2 (#2). Test Example 4 (#4) shows the total amount of outgas in the organic insulating layer formed by coating the acryl and curing it at about 230° C., and Test Example 5 (#5) shows the total amount of outgas after the helium plasma treatment on the organic insulating layer formed under the same material and conditions as in Test Example 4 (#4). The organic insulating layers of Test Example 1 (#1), Test Example 2 (#2), and Test Example 4 (#4) were not plasma treated.

As in Test Example 2 (#2) and Test Example 4 (#4), the organic insulating layer formed of the acryl had a total amount of outgas that was three times greater than that of the organic insulating layer formed of the polyimide. However, as in Test Example 3 (#3) and Test Example 5 (#5), it was confirmed that even when formed of the acryl, the total amount of outgas was significantly reduced in the organic insulating layer treated with helium plasma.

From these results, it can be seen that the outgasing and shrinkage may be suppressed by forming the insulating layer 181, the insulating layer 182, and/or the insulating layer 190 with the acryl-based polymer and treating them with helium plasma. Accordingly, it is possible to improve the reliability of the display device while reducing the manufacturing cost as compared with when using the polyimide for the insulating layer 181, the insulating layer 182, and/or the insulating layer 190.

Figure 13:
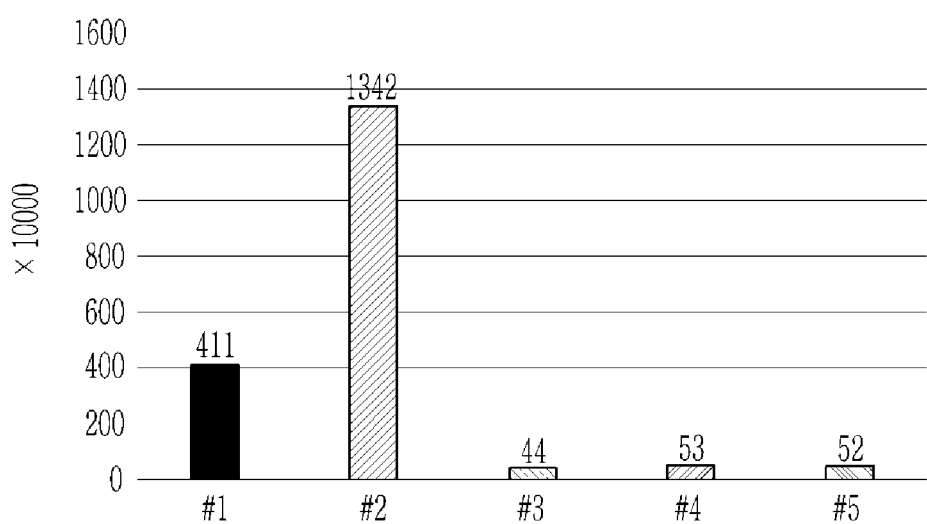
FIG. 13, FIG. 14 and FIG. 15 illustrate graphs showing a total amount of outgas depending on a process condition of a helium plasma treatment.
Figure 14:
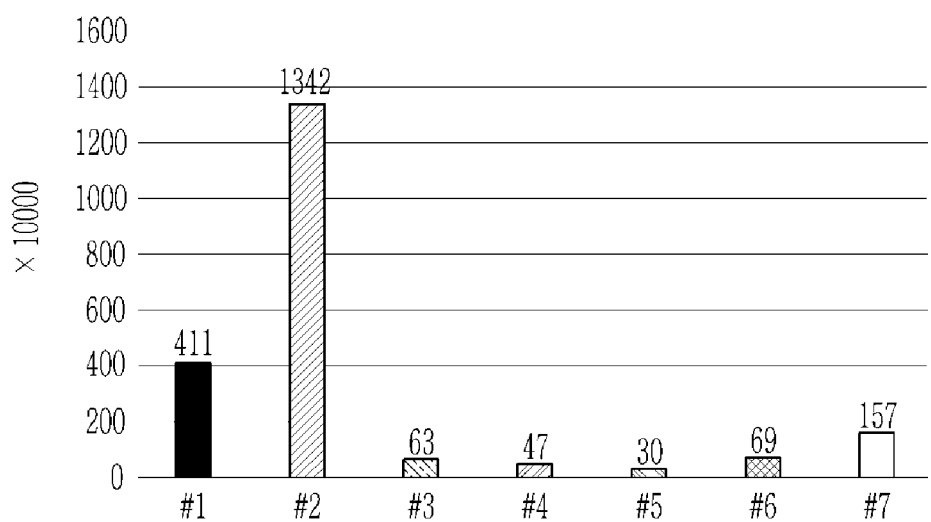
Figure 15:
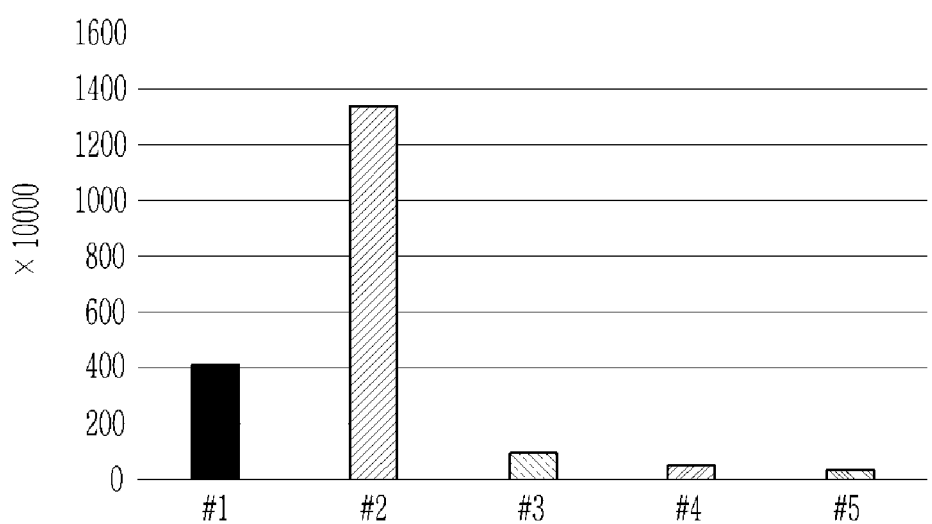

FIG. 13, FIG. 14, and FIG. 15 illustrate a graph showing a total amount of outgas depending on a process condition of a helium plasma treatment. FIG. 13 illustrates a result depending on a process pressure of the helium plasma treatment, FIG. 14 illustrates a result depending on a process power of the helium plasma treatment, and FIG. 15 illustrates a result depending on a process time of the helium plasma treatment.

Referring to FIG. 13, Test Example 1 (#1) shows the total amount of outgas in the organic insulating layer formed by coating the polyimide and curing it at about 250° C. Test Example 2 (#2) shows the total amount of outgas in the organic insulating layer (not subjected to plasma treatment) formed by coating the acryl and curing it at about 230° C. Test Example 3 (#3), Test Example 4 (#4), and Test Example 5 (#5) show the total amounts of outgas after the helium plasma treatment with a process pressure of about 10 mT, about 80 mT, and about 150 mT is performed on the organic insulating layer formed under the same material and the same conditions as in Test Example 2 (#2), respectively. As shown in Test Example 3 (#3), Test Example 4 (#4), and Test Example 5 (#5), it was found that the total amount of outgas was significantly reduced when the helium plasma treatment was performed by varying the process pressure in a range of about 10 mT to about 150 mT. However, it was confirmed that an outgas reduction effect was small at a process pressure of about 200 mT or more.

Referring to FIG. 14, Test Example 1 (#1) and Test Example 2 (#2) are the same as Test Example 1 (#1) and Test Example 2 (#2) shown in FIG. 13, respectively. Test Example 3 (#3), Test Example 4 (#4), Test Example 5 (#5), Test Example 6 (#6), and Test Example 7 (#7) show the total amount of outgas after the helium plasma treatment with process powers having source/bias powers of 500 W/0 W, 1000 W/0 W, 1000 W/300 W, 2000 W/500 W, and 2000 W/1000 W is performed on the organic insulating layer formed under the same material and conditions as in Test Example 2 (#2), respectively. It was found that the total amount of outgas was significantly reduced during the helium plasma treatment by varying the process powers in ranges of about 500 W to about 2000 W of source powers and about 0 W to about 1000 W of bias powers. When the source power was lowered below 500 W, it was difficult to obtain data due to unstable discharge.

Referring to FIG. 15, Test Example 1 (#1) and Test Example 2 (#2) are the same as Test Example 1 (#1) and Test Example 2 (#2) shown in FIG. 13, respectively. Test Example 3 (#3), Test Example 4 (#4), and Test Example 5 (#5) show the total amounts of outgas after the helium plasma treatment is performed on the organic insulating layer formed under the same material and the same conditions as in Test Example 2 (#2) during process times of 15 seconds (s), 60 s, and 120 s, respectively. As shown in Test Example 3 (#3), Test Example 4 (#4), and Test Example 5 (#5), it was found that the total amount of outgas was significantly reduced when the helium plasma treatment was performed by varying the process time in a range of about 15 s to about 120 s.

Figure 16:
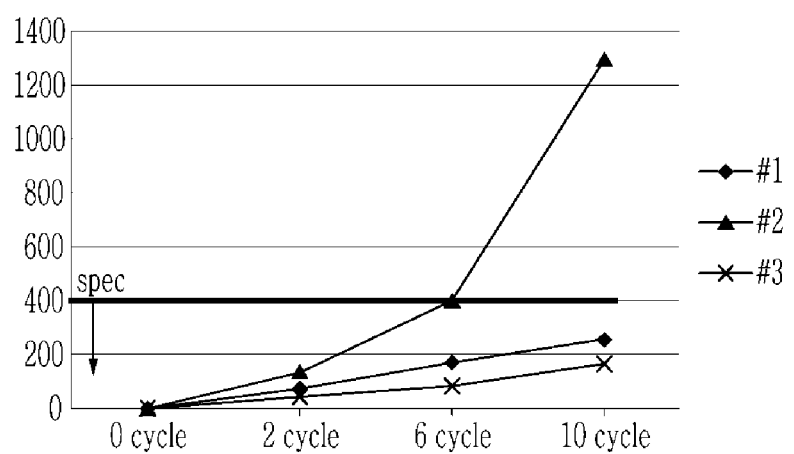
FIG. 16 and FIG. 17 illustrate graphs showing results of reliability evaluation of an organic insulating layer.
Figure 17:
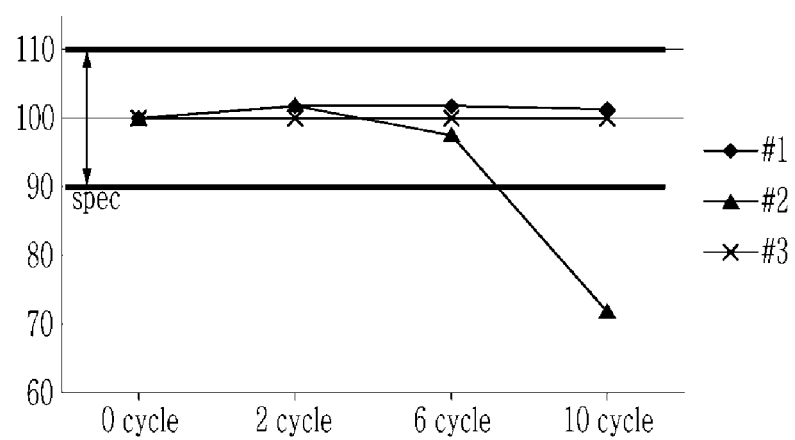

FIG. 16 and FIG. 17 illustrate graphs showing results of reliability evaluation of an organic insulating layer.

Reliability of the display device, particularly solar reliability, was evaluated. Test Example 1 (#1) is related to a display panel in which an organic insulating layer is formed of the polyimide, Test Example 2 (#2) is related to a display panel in which an organic insulating layer (not subjected to plasma treatment) includes or is formed of the acryl, and Test Example 3 (#3) is related to a display panel formed by forming an organic insulating layer with the acryl and then performing the helium plasma treatment on it. The test was repeated for 10 cycles, where one cycle includes a) covering half of a screen and starting to emit light (1120 watts per square meters ($W/m^2$)) in a chamber at about 25° C. in a non-driven state, b) increasing the temperature from about 25° C. to about 40° C. for about 6 hours (h) and maintaining it for 4 h, c) irradiating light for about 8 h from 2 h after the temperature started to rise and irradiating no light for remaining about 16 h, and d) decreasing the temperature from about 40° C. to about 25° C. for about 10 h and maintaining it for about 4 h. FIG. 16 illustrates a color temperature obtained by measuring color coordinates and luminance of light-exposed and non-exposed areas on the screen for each cycle, and FIG. 17 illustrates a luminance ratio thereof.

Referring to FIG. 16, in the case of Test Example 2 (#2), the color temperature difference was within about 400 K, which is a specification range, until 6 cycles, but it was outside the specification range after 6 cycles. In the case of Test Example 3 (#3) in which it was subjected to the helium plasma treatment, the color temperature difference was within about 200 Kelvin (K), and was lower than in Test Example 1 (#1).

Referring to FIG. 17, in the case of Test Example 2 (#2), the luminance ratio was about −70 percentages (%) in 10 cycles, which was significantly outside the specification range of ±10%. In Test Example 3 (#3), there was little change in luminance even in 10 cycles, and the luminance ratio was lower than in Test Example 1 (#1).

Even when an acryl is used as the organic insulating layer of the display panel as described above, it is possible to secure reliability that is equal to or higher than that of a polyimide when the helium plasma treatment is performed.

Figure 18:
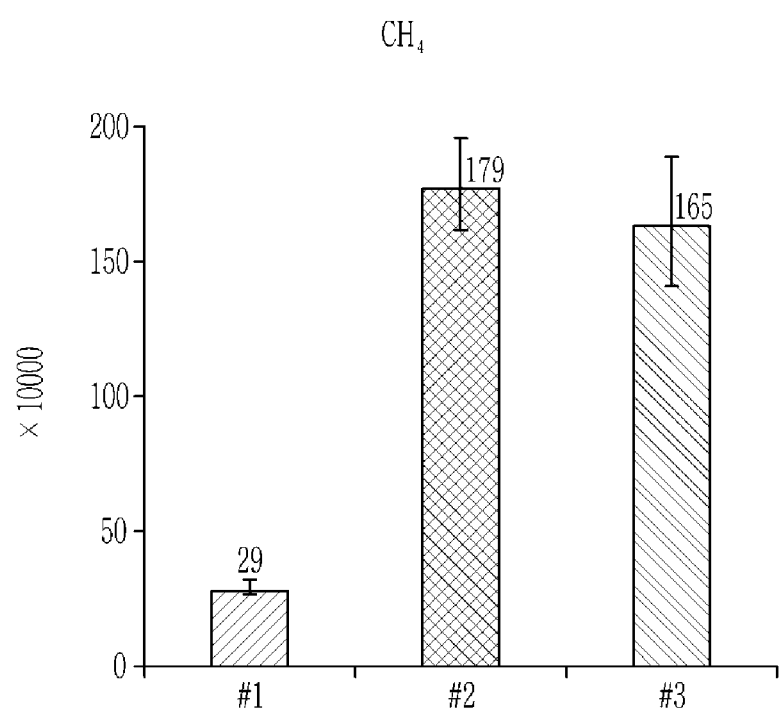
FIG. 18 illustrates a graph showing a result of permanent analysis of an organic insulating layer.

FIG. 18 illustrates a graph showing a result of permanent analysis of an organic insulating layer. FIG. 18 illustrates a result of analyzing methane ($CH_4$) in the organic insulating layer.

In FIG. 18, Test Example 1 (#1) is related to an organic insulating layer formed of the acryl (not subjected to the plasma treatment), Test Example 1 (#2) is related to an organic insulating layer formed of the acryl and subjected to the helium plasma treatment, and Test Example (#3) is related to an organic insulating layer formed of the acryl and subjected to the argon plasma treatment. It was found that a methane content of the organic insulating layer, which was subjected to the helium or argon plasma treatment, increased by about 5 to 6 times compared to that of the organic insulating layer which was not subjected to the plasma treatment. Therefore, it can be confirmed whether or not to perform the plasma treatment on the acrylic organic insulating layer by analyzing a methane content of the acrylic organic insulating layer.

While the inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A manufacturing method of a display device, comprising:
    forming a transistor on a substrate;
    forming an organic insulating layer on the transistor; and
    performing a plasma treatment on the organic insulating layer,
    wherein the organic insulating layer includes an acryl-based polymer, and the plasma treatment is performed by using helium gas or argon gas,
    wherein a methane content increases in the organic insulating layer by the plasmas treatment.

2. The manufacturing method of claim 1, wherein
    single and double bonds of carbon and oxygen in the organic insulating layer are broken by the plasma treatment.

3. The manufacturing method of claim 1,
    wherein the organic insulating layer defines an opening, and
    further comprising:
    forming a light emission member of a light emitting diode overlapping the opening in a plan view after the performing of the plasma treatment.

4. The manufacturing method of claim 1, further comprising
    forming a first electrode of a light emitting diode on the organic insulating layer after the performing of the plasma treatment.

5. The manufacturing method of claim 1, wherein
    the plasma treatment is performed at a process temperature of about 200 degrees in Celsius (° C.) to about 300° C.

6. The manufacturing method of claim 1, wherein
    the plasma treatment is performed at a process pressure of about 10 millitorrs (mT) to about 200 mT.

7. The manufacturing method of claim 1, wherein
    the plasma treatment is performed at a process power of a source power of about 500 watts (W) or more and a bias power of about 0 W or more.

8. The manufacturing method of claim 1, wherein
    the plasma treatment is performed for a process time of about 15 seconds or more.

9. A manufacturing method of a display device, comprising:
    forming a transistor on a substrate;
    forming an organic insulating layer including an acryl-based polymer on the transistor; and
    performing a plasma treatment on the organic insulating layer,
    wherein the plasma treatment is performed using only helium gas or argon gas, and single or double bonds of carbon and oxygen in the organic insulating layer are broken by the plasma treatment.

10. The manufacturing method of claim 9, wherein
    a methane content increases in the organic insulating layer by the plasma treatment.

11. The manufacturing method of claim 9,
    wherein the organic insulating layer defines an opening, and
    further comprising:
    forming a light emission member of a light emitting diode overlapping the opening in a plan view after the performing of the plasma treatment.

12. The manufacturing method of claim 9, further comprising
    forming a first electrode of a light emitting diode on the organic insulating layer after the performing of the plasma treatment.

13. The manufacturing method of claim 9, wherein
    the plasma treatment is performed at a process temperature of about 200° C. to about 300° C.

14. The manufacturing method of claim 9, wherein
    the plasma treatment is performed at a process pressure of about 10 mT to about 200 mT.

15. The manufacturing method of claim 9, wherein
    the plasma treatment is performed at a process power of a source power of about 500 W or more and a bias power of about 0 W or more.

16. The manufacturing method of claim 9, wherein
    the plasma treatment is performed for a process time of about 15 seconds or more.

17. A manufacturing method of a display device, comprising:
    forming a transistor on a substrate;
    forming an organic insulating layer on the transistor; and
    performing a plasma treatment on the organic insulating layer,
    wherein the organic insulating layer includes an acryl-based polymer, and the plasma treatment is performed by using helium gas or argon gas, and
    wherein the plasma treatment is performed at a process temperature of about 200 degrees in Celsius (° C.) to about 300° C.

* * * * *